(12) United States Patent
Vaghela (10) Patent No.: US 10,026,706 B2
(45) Date of Patent: Jul. 17, 2018

(54) ADDING CAP TO COPPER PASSIVATION FLOW FOR ELECTROLESS PLATING

(75) Inventor: Pragnesh R. Vaghela, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/295,379

(22) Filed: Nov. 14, 2011

(65) Prior Publication Data

US 2012/0119364 A1 May 17, 2012

(51) Int. Cl.
*H01L 21/44* (2006.01)
*H01L 23/00* (2006.01)

(52) U.S. Cl.
CPC .............. *H01L 24/11* (2013.01); *H01L 24/03* (2013.01); *H01L 24/05* (2013.01); *H01L 24/13* (2013.01); *H01L 24/45* (2013.01); *H01L 2224/0401* (2013.01); *H01L 2224/04042* (2013.01); *H01L 2224/05644* (2013.01); *H01L 2224/05647* (2013.01); *H01L 2224/05655* (2013.01); *H01L 2224/05664* (2013.01); *H01L 2224/131* (2013.01); *H01L 2224/13099* (2013.01); *H01L 2224/45124* (2013.01); *H01L 2224/45144* (2013.01); *H01L 2224/45147* (2013.01); *H01L 2224/48644* (2013.01); *H01L 2224/48647* (2013.01); *H01L 2224/48655* (2013.01); *H01L 2224/48664* (2013.01); *H01L 2224/48747* (2013.01); *H01L 2224/48755* (2013.01); *H01L 2224/48764* (2013.01); *H01L 2224/48844* (2013.01); *H01L 2224/48847* (2013.01); *H01L 2224/48855* (2013.01); *H01L 2224/48864* (2013.01); *H01L 2924/0001* (2013.01); *H01L 2924/01005* (2013.01); *H01L 2924/01006* (2013.01); *H01L 2924/01013* (2013.01); *H01L 2924/01014* (2013.01); *H01L 2924/01028* (2013.01); *H01L 2924/01029* (2013.01); *H01L 2924/01047* (2013.01); *H01L 2924/01074* (2013.01); *H01L 2924/01079* (2013.01); *H01L 2924/01082* (2013.01); *H01L 2924/10253* (2013.01); *H01L 2924/14* (2013.01)

(58) Field of Classification Search
CPC ......... H01L 24/05; H01L 24/13; H01L 24/16; H01L 24/03; H01L 24/11; H01L 24/06; H01L 24/08; H01L 24/10
USPC .......................................... 438/612; 257/750
See application file for complete search history.

(56) References Cited

U.S. PATENT DOCUMENTS 6,153,448 A * 11/2000 Takahashi ........... H01L 23/3114
257/737
6,633,081 B2 * 10/2003 Sahara ................ H01L 23/3114
257/738

* cited by examiner

*Primary Examiner* — Theresa T Doan
(74) *Attorney, Agent, or Firm* — Jacqueline J. Garner; Charles A. Brill; Frank D. Cimino (57) ABSTRACT

An integrated circuit includes a metal seed layer contacting a metal element of a top interconnect layer, a plated copper pad over the seed layer, a plated metal cap layer on the top surface of the copper pad, an upper protective overcoat covering a lateral surface of the copper pad and overlapping a top surface of the cap layer with a bond pad opening exposing the cap layer, and a bond pad of electroless plated metal in the bond pad opening.

10 Claims, 9 Drawing Sheets

ADDING CAP TO COPPER PASSIVATION FLOW FOR ELECTROLESS PLATING

FIELD OF THE INVENTION

This invention relates to the field of integrated circuits. More particularly, this invention relates to interconnect structures in integrated circuits.

BACKGROUND OF THE INVENTION

An integrated circuit may include a copper pad and a dielectric protective overcoat on the copper pad with an opening for a bond pad. An electroless-plated bond pad may be disposed in the opening on the copper pad. Forming the integrated circuit so that the dielectric protective overcoat provides a desired level of chemical isolation for the copper pad may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In one embodiment, the invention relates to an integrated circuit including a copper pad which is electrically contacting a metal element of a top interconnect level. A metal cap layer, which does not contain copper, is disposed on a top surface of the copper pad, while lateral surfaces of the copper pad are substantially free of the cap layer metal. A dielectric upper protective overcoat is disposed over the integrated circuit, overlapping a top surface of the metal cap layer and covering lateral sides of the copper pad. The upper protective overcoat has a bond pad opening at the top surface of the metal cap layer, and a bond pad formed by an electroless plating process is disposed in the bond pad opening.

In another embodiment, the invention relates to a process of forming an integrated circuit includes the steps of: forming a metal seed layer over the integrated circuit and contacting the metal element of a top interconnect level, forming a plating mask over the seed layer which exposes an area for the copper pad over the metal element, forming the copper pad using a plating operation, forming the metal cap layer on a top surface of the copper pad using a plating operation, removing the plating mask, forming a dielectric upper protective overcoat over the integrated circuit covering lateral surfaces of the copper pad and overlapping the top surface of the metal cap layer with a bond pad opening at the top surface of the metal cap layer, and forming a bond pad in the bond pad opening using an electroless plating process.

DETAILED DESCRIPTION OF EXAMPLE EMBODIMENTS

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
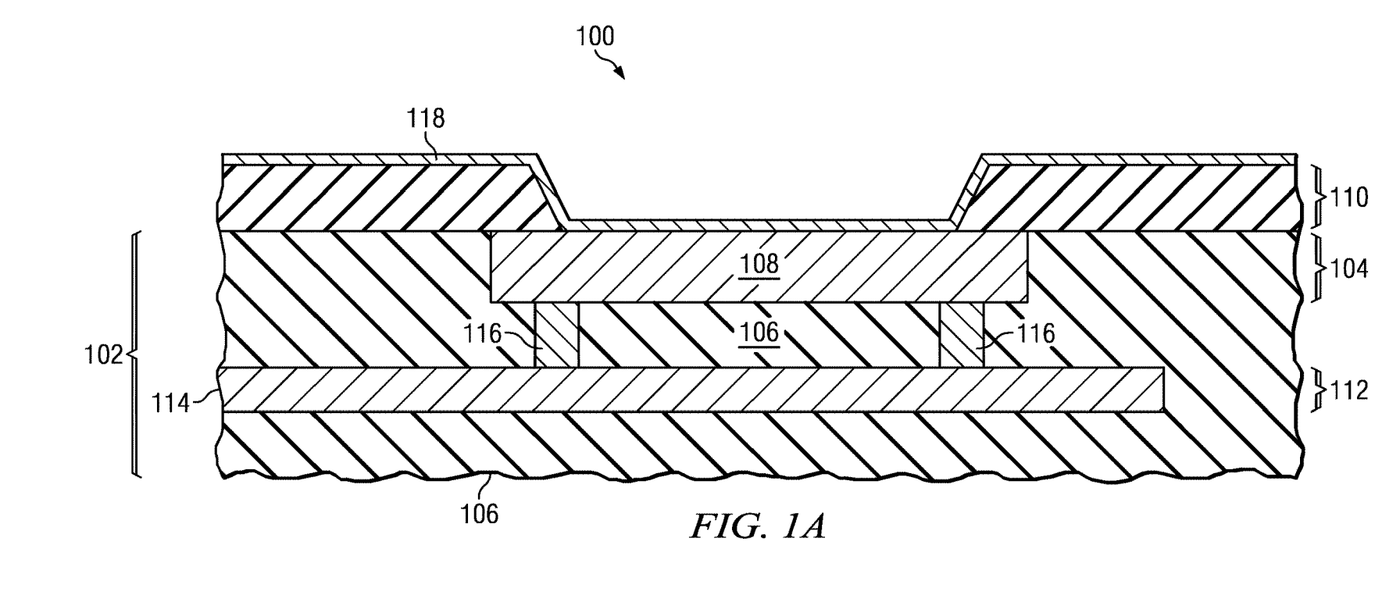
FIG. 1A through FIG. 1H are cross sections of an integrated circuit formed according to an embodiment, depicted in successive stages of fabrication.

FIG. 1A through FIG. 1H are cross sections of an integrated circuit formed according to an embodiment, depicted in successive stages of fabrication. Referring to FIG. 1A, the integrated circuit 100 includes an interconnect region 102 with a top interconnect level 104 in a dielectric layer stack 106. The dielectric layer stack 106 may include, for example, layers of silicon dioxide, phosphosilicate glass, boron phosphosilicate glass, fluoro-silicate glass, organo-silicate glass, carbon-doped silicon oxides, and/or dielectric material formed from methylsilsesquioxane (MSQ). The interconnect region 102 overlies a semiconductor substrate of the integrated circuit 100. The substrate may be, for example, a single crystal silicon wafer, a silicon-on-insulator (SOI) wafer, a hybrid orientation technology (HOT) wafer with regions of different crystal orientations, or other material appropriate for fabrication of the integrated circuit 100. Electronic components of the integrated circuit 100 such as transistors may be formed in and on the substrate.

A metal element 108 of the top interconnect level 104 is exposed, for example by an opening in a lower protective overcoat 110. In one version of the instant embodiment, the metal element 108 may include a main layer of aluminum alloy under a cap layer of refractory metal, such as titanium nitride. In another version, the metal element 108 may include a main layer of copper. The lower protective overcoat 110 may include, for example, one or more layers of silicon dioxide, silicon nitride and/or silicon oxy-nitride. The interconnect region 102 may include a lower interconnect level 112 with a metal lead 114 connected to the metal element 108 of the top interconnect level 104 by vias 116.

A metal seed layer 118 is formed over the integrated circuit 100 so as to make electrical connection to the metal element 108 of the top interconnect level 104 and to overlap onto the lower protective overcoat 110. The seed layer may include, for example, a sputtered layer of titanium tungsten alloy, 100 to 500 nanometers thick, contacting the lower protective overcoat 110 and the metal element 108, and a sputtered layer of copper, 100 to 300 nanometers thick, on the layer of titanium tungsten alloy. Seed layers of other metals, such as nickel, may also be used.

Figure 1B:
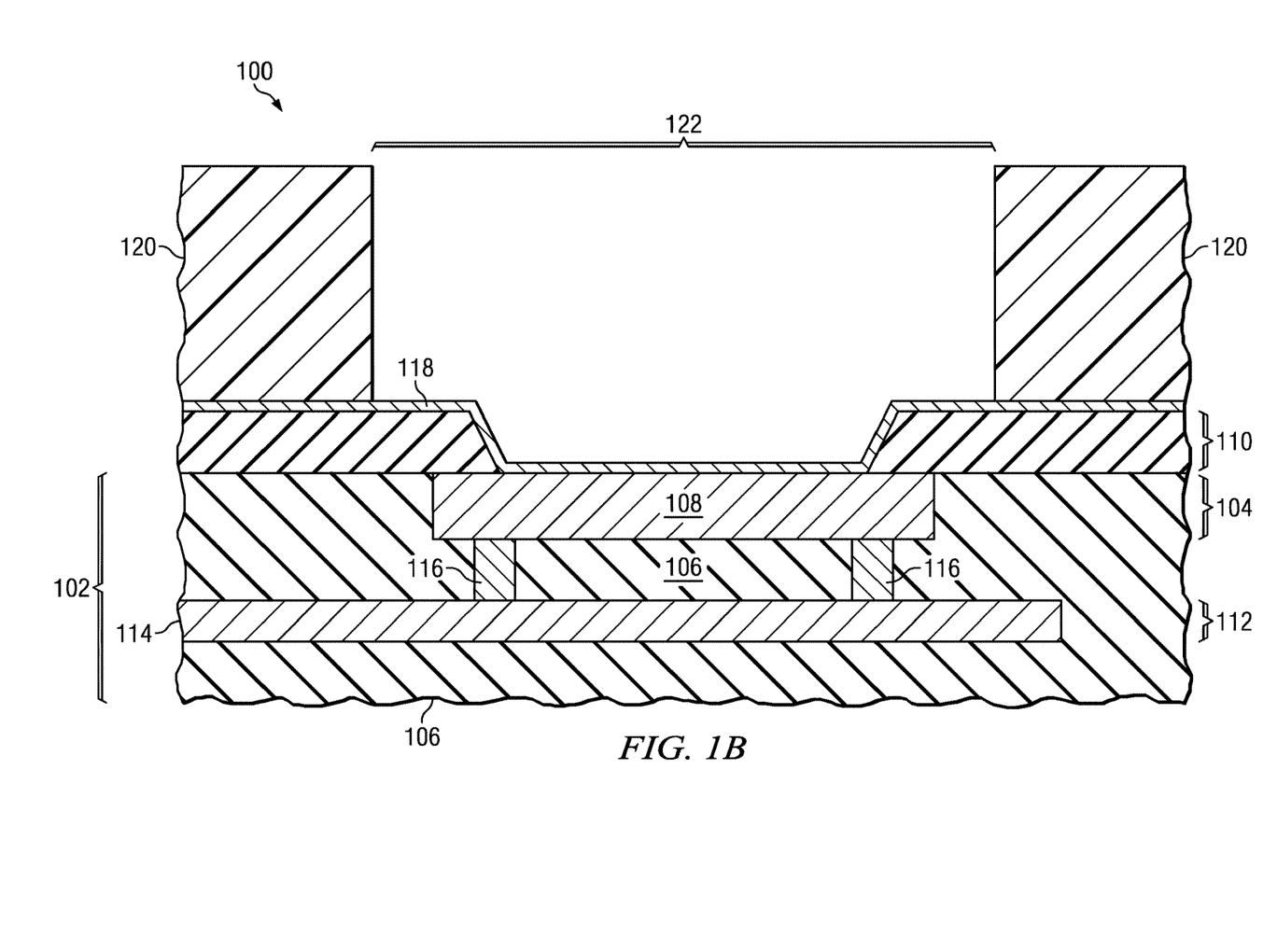

Referring to FIG. 1B, a plating mask 120 is formed over the integrated circuit 100 so as to expose an area 122 for subsequent formation of a copper pad over the metal element 108 of the top interconnect level 104. The plating mask may include, for example, photoresist with a thickness of 8 to 20 microns.

Figure 1C:
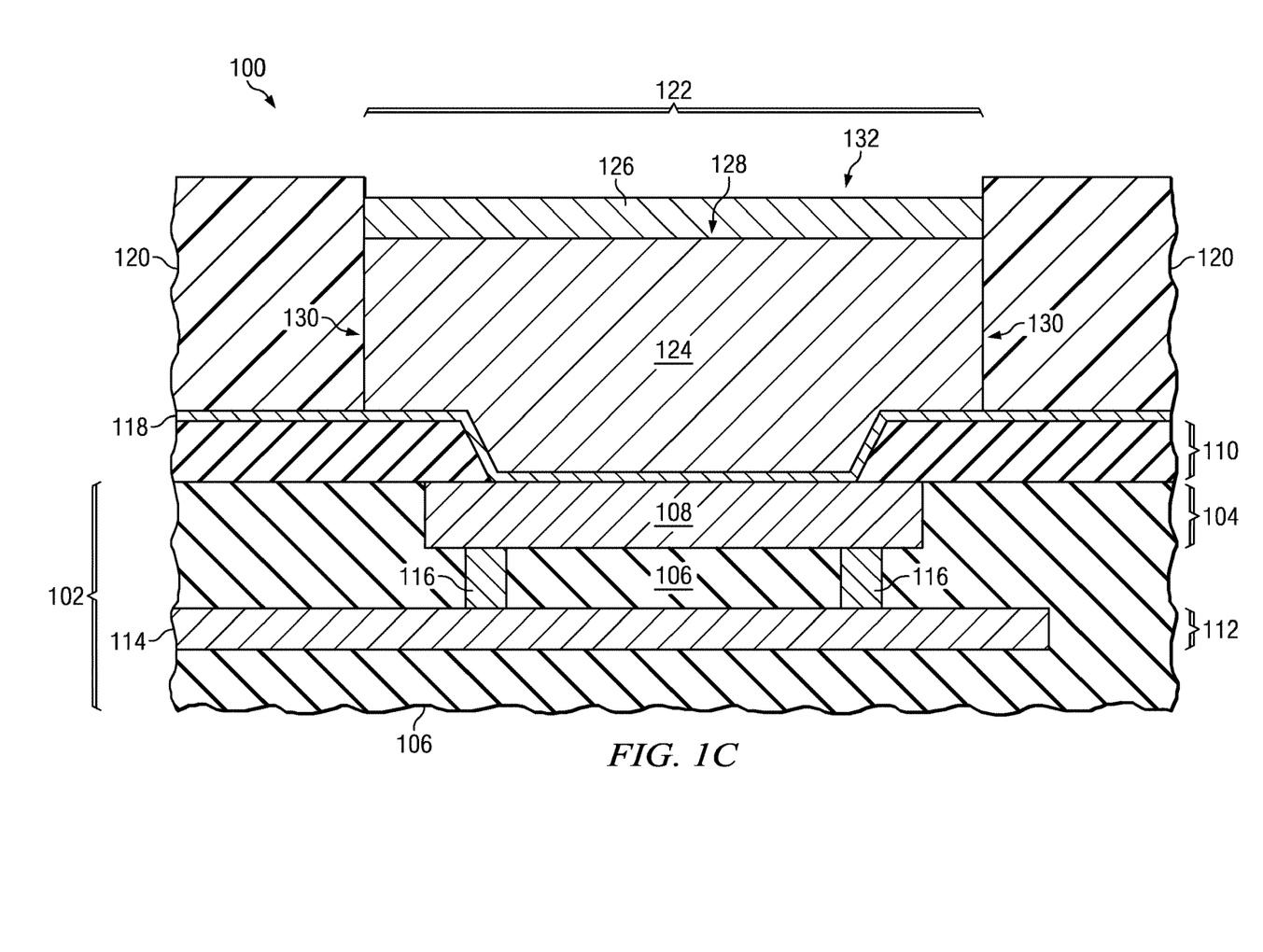

Referring to FIG. 1C, a first plating operation is performed which forms a copper pad 124 over the metal element 108 in the exposed area 122 of the plating mask 120. The copper pad 124 makes electrical connection to the seed layer 118. In one version of the instant embodiment, the first plating operation may include an electroplating process to form the majority of the copper pad 124. In an alternate version, the majority of the copper pad 124 may be formed by an electroless plating process. Additional metal layers may be formed between the seed layer 118 and the copper pad 124. In one version of the instant embodiment, the copper pad 124 may be 6 to 15 microns thick. In another version, the copper pad 124 may be 3 to 6 microns thick.

A second plating operation is performed which forms a metal cap layer 126 free of copper on a top surface 128 of the copper pad 124. The second plating operation is performed so that a lateral surface 130 of the copper pad 124 is substantially free of metal of the cap layer 126. It will be recognized that some metal of the cap layer 126 may be plated onto the lateral surface 130 proximate to the top surface 128 due to unintended separation of the plating mask 120 from the copper pad 124. The metal cap layer 126 may include, for example, one or more layers of nickel, palladium, gold, and/or silver. The metal cap layer 126 may be, for example, 1 to 3 microns thick. The second plating operation may include electroplating and/or electroless plating processes. In one version of the instant embodiment, a top surface 132 of the metal cap layer 126 may be below a top surface of the plating mask 120.

Figure 1D:
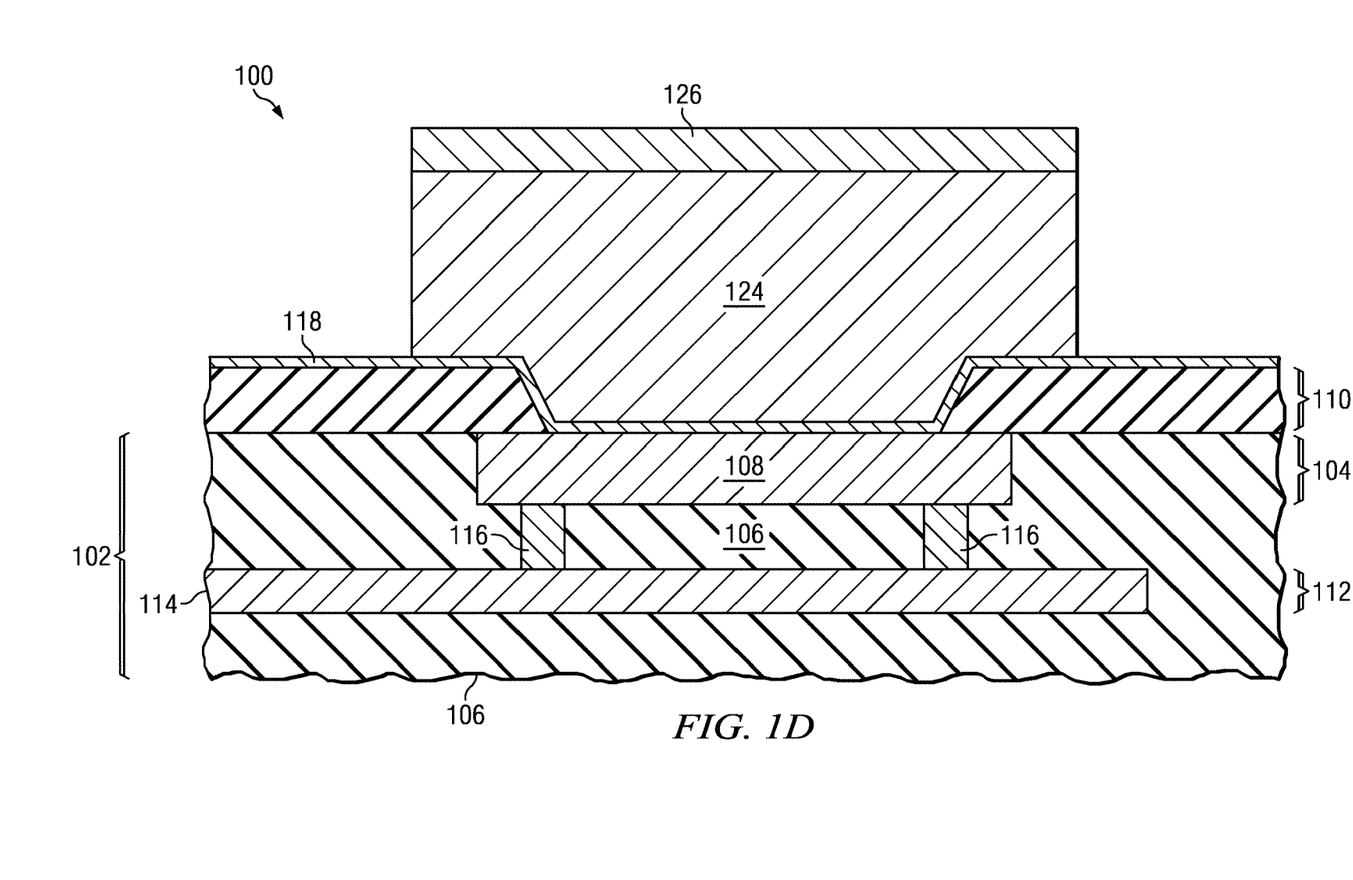

Referring to FIG. 1D, the plating mask 120 is removed so as to expose the seed layer 118 adjacent to the copper pad 124. The plating mask 120 may be removed, for example, by exposing the integrated circuit 100 to oxygen radicals or by dissolving the plating mask 120 in organic solvents.

Figure 1E:
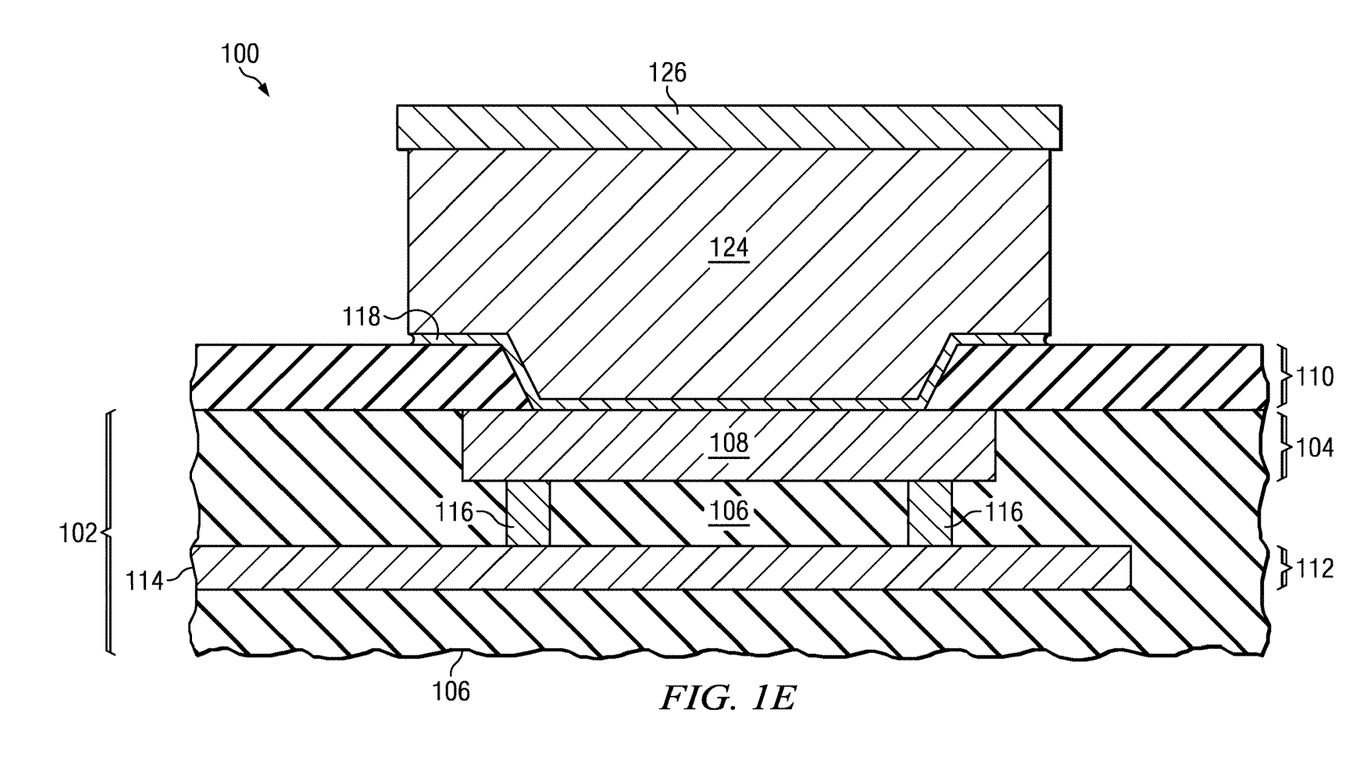

Referring to FIG. 1E, a seed layer etch process is performed which removes a portion of the seed layer 118 outside the copper pad 124 so that the copper pad 124 is not electrically connected to other copper pads through the seed layer 118. The seed layer etch process may include, for example, a first wet etch step using a sulfuric acid/hydrogen peroxide/water mixture at 25 to 35° C. which removes a copper layer from the seed layer 118 and a second wet etch step using hydrogen peroxide at 40 to 60° C. which removes a titanium tungsten layer from the seed layer 118. Other etch steps which remove portions of the seed layer 118 are within the scope of the instant embodiment. Copper may be removed from the lateral surface 130 of the copper pad 124 during the seed layer etch process so as to recess the lateral surface 130 under the metal cap layer 126 as depicted in FIG. 1E.

Figure 1F:
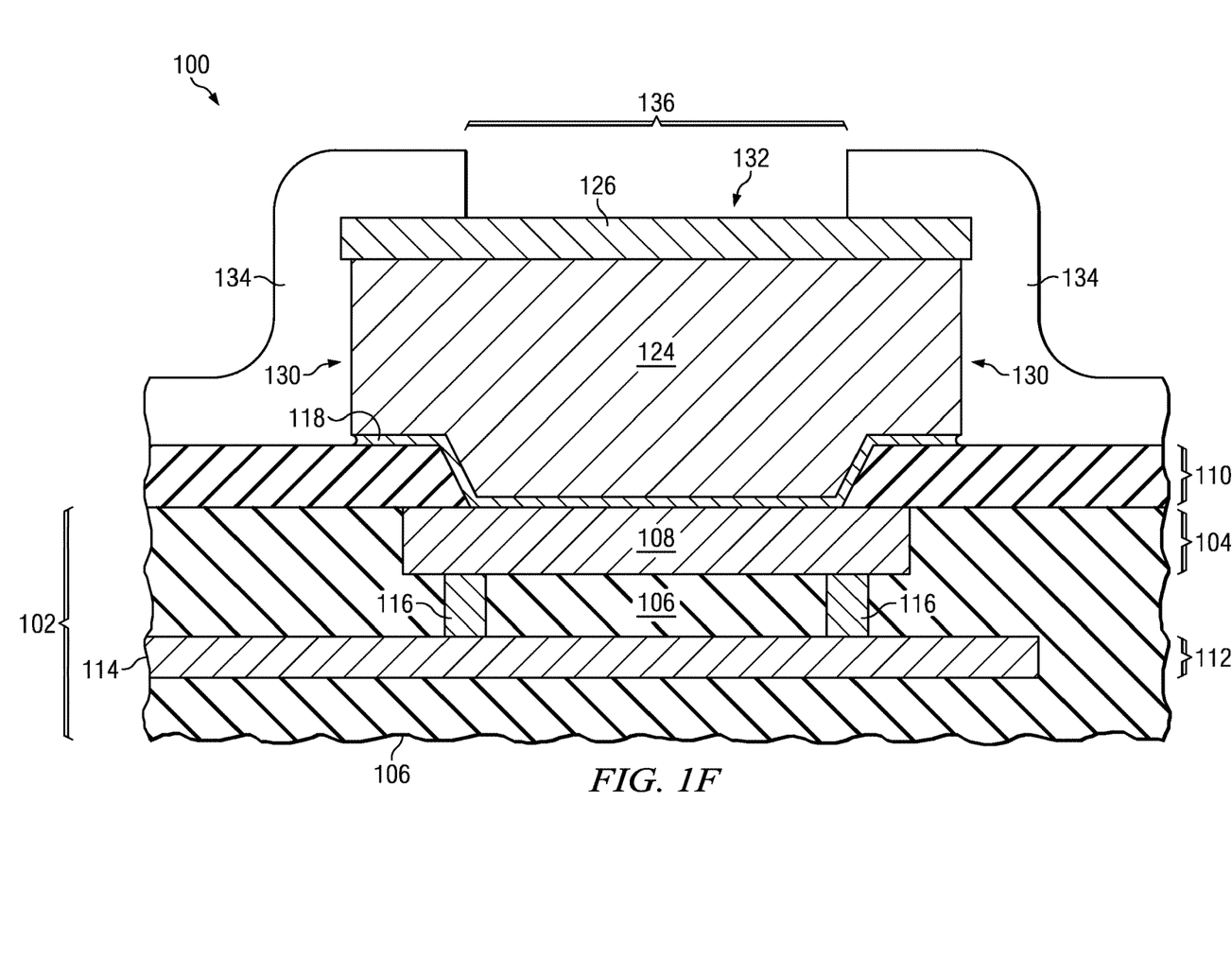

Referring to FIG. 1F, an upper protective overcoat 134 is formed over the integrated circuit 100 overlapping the top surface 132 of the metal cap layer 126 and covering the lateral surface 130 of the copper pad 124. The upper protective overcoat 134 has a bond pad opening 136 which exposes a portion of the metal cap layer top surface 132. The upper protective overcoat 134 may be, for example, 2 to 4 microns thick.

The upper protective overcoat 134 may include, for example, polyimide, polybenzoxazole (PBO), benzocyclobutene (BCB), parylene, or other organic polymer suitable for forming an integrated circuit protective overcoat. In one version of the instant embodiment, the upper protective overcoat 134 may be formed of a photosensitive polymer such as polyimide, so that the bond pad opening 136 may be formed by exposing the upper protective overcoat 134 directly followed by a develop operation. In another version, the bond pad opening 136 may be formed by forming a separate etch mask over the upper protective overcoat 134 which exposes the bond pad opening 136 and removing material from the upper protective overcoat 134 in the bond pad opening 136.

Figure 1G:
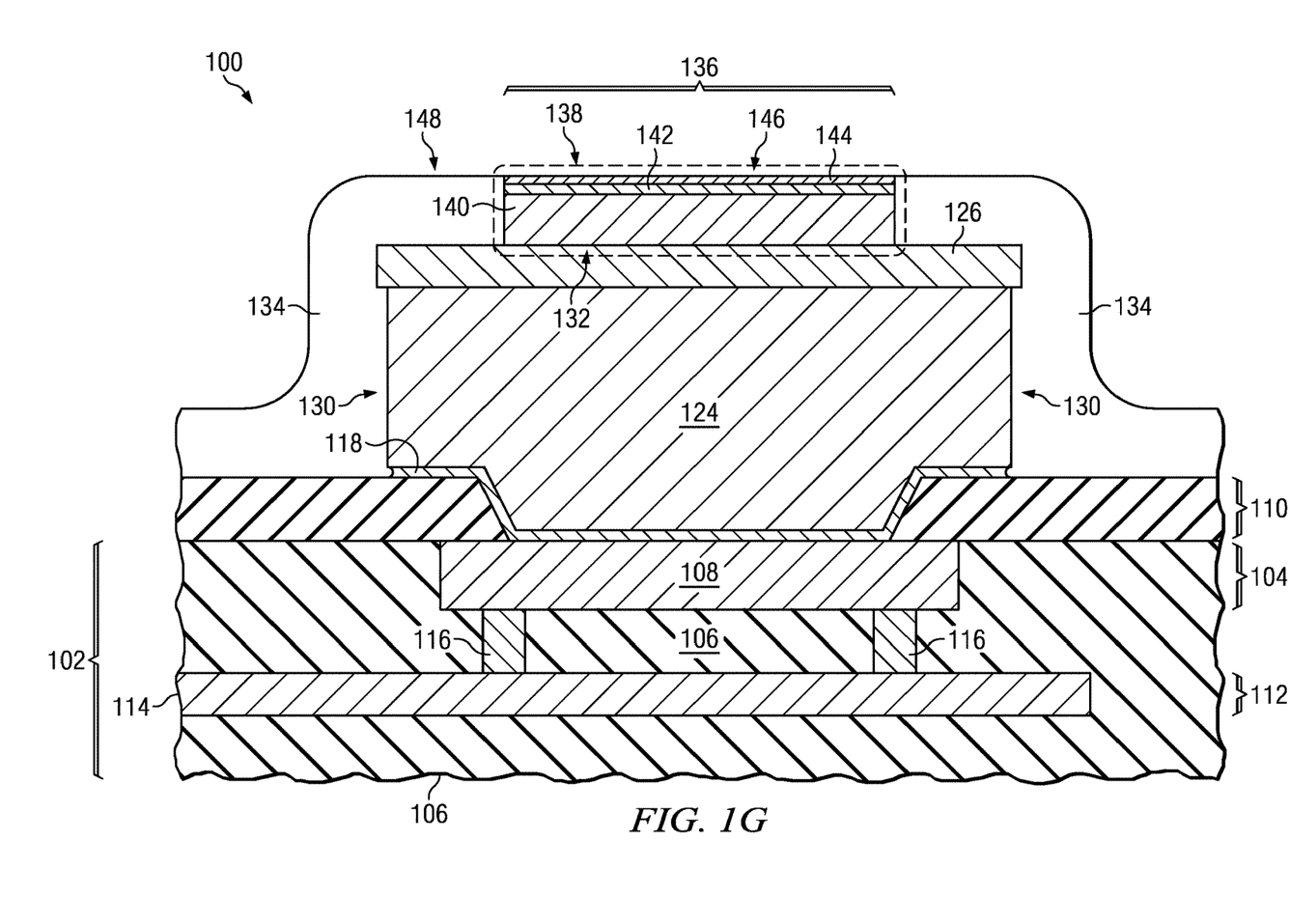

Referring to FIG. 1G, a bond pad 138 is formed in the bond pad opening 136 on the top surface 132 of the metal cap layer 126. The bond pad 138 is formed by electroless plating at least one layer of bond pad metal, such as nickel, palladium, copper or gold. In one version of the instant embodiment, the bond pad 138 may include a nickel layer 140 1 to 3 microns thick on the metal cap layer 126, a palladium layer 142 200 to 500 nanometers thick on the nickel layer 140, and a gold layer 144 50 to 150 nanometers thick on the palladium layer 142. In one version of the instant embodiment, a top surface of the bond pad 146 may be coplanar with a top surface 148 of the upper protective overcoat 134 within 100 nanometers. Forming the metal cap layer 126 over the copper pad 124 and overlapping the upper protective overcoat 134 on the metal cap layer 126 may advantageously reduce deterioration of the copper pad 124 during the electroless plating operation used to form the bond pad 138.

Figure 1H:
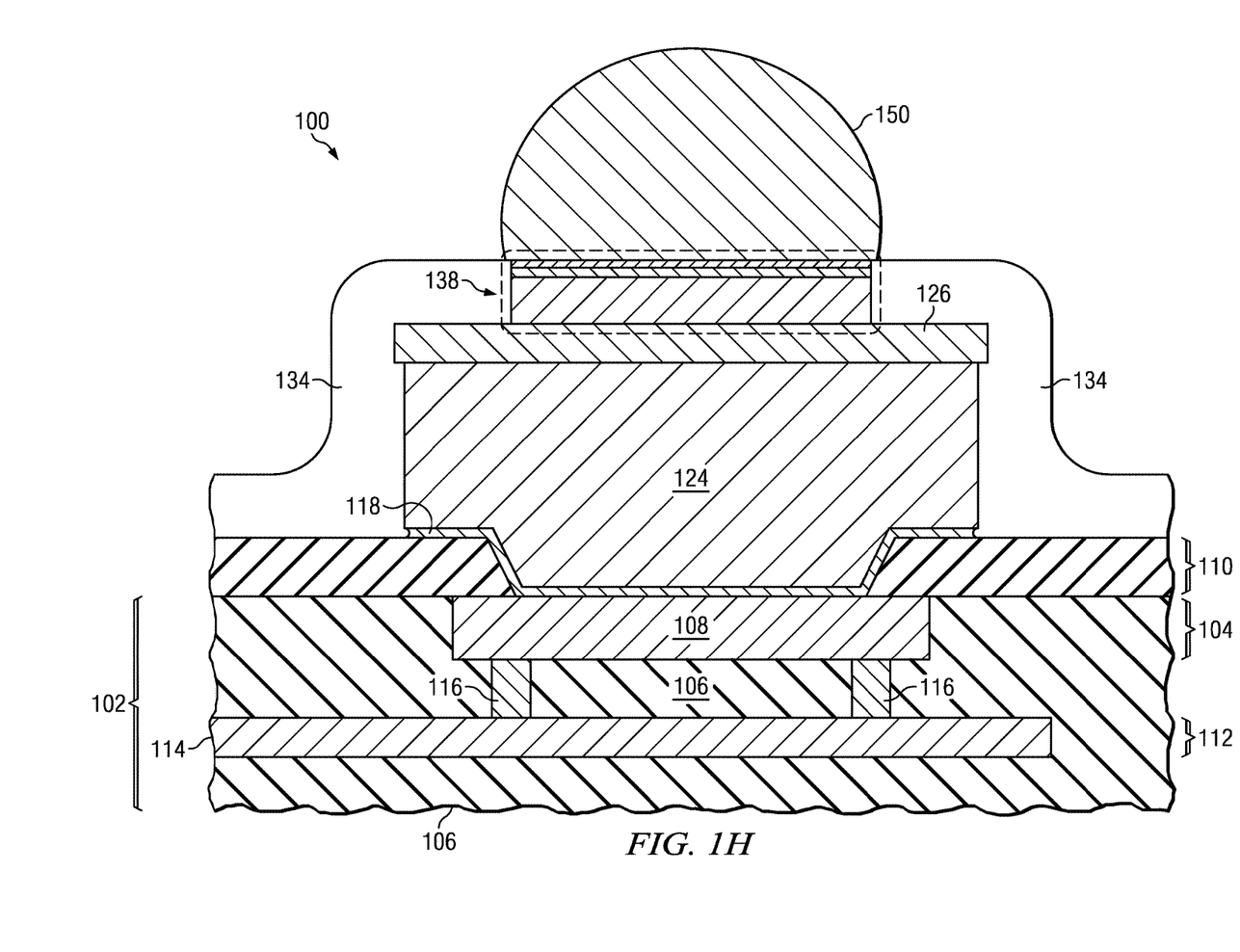

In one version of the instant embodiment, the bond pad 138 provides a wirebond pad, so that a wirebond connection may be made to the bond pad 138. The wirebond connection may use, for example, a gold wire, a copper wire or an aluminum wire. In another version, a bump bond connection may be made to the bond pad 138. Referring to FIG. 1H, a reflow bump 150 is formed on the bond pad 138, for example by depositing bump metal on the bond pad 138 followed by a reflow operation which melts the bump metal and reflows it to form the bump 150.

Figure 2:
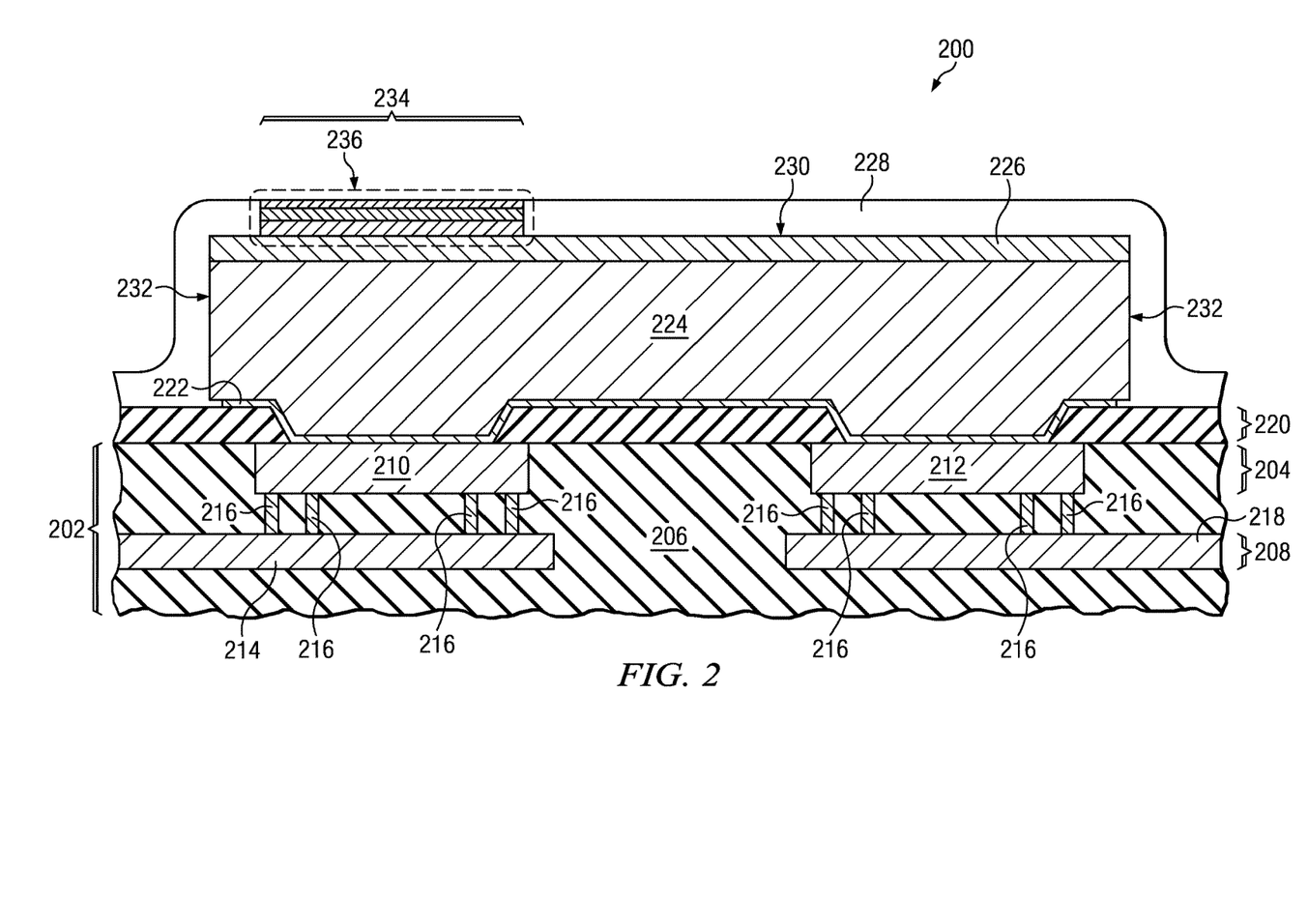
FIG. 2 is a cross section of an integrated circuit including a copper pad configured according to another embodiment.

FIG. 2 is a cross section of an integrated circuit including a copper pad configured according to another embodiment. The integrated circuit 200 includes an interconnect region 202 with a top interconnect level 204 in a dielectric layer stack 206 as described in reference to FIG. 1A. The interconnect region 202 further contains a lower interconnect level 208. The top interconnect level 204 includes a first metal element 210 and a second metal element 212 which is not electrically connected to the first metal element 210 by elements of the top interconnect level 204. The lower interconnect level 208 includes a first lead 214 which is electrically connected to the first metal element 210 by instances of vias 216 between the top interconnect level 204 and the lower interconnect level 208. The lower interconnect level 208 further includes a second lead 218 which is electrically connected to the second metal element 212 by other instances of the vias 216. The second lead 218 is not electrically connected to the first lead 214 by elements of the lower interconnect level 208. A lower protective overcoat 220 as described in reference to FIG. 1A is formed over the top interconnect level 204 with a first opening over the first metal element 210 and a second opening over the second metal element 212. In the instant embodiment, the first opening and the second opening do not abut or overlap.

A metal seed layer 222, a copper pad 224 and a metal cap layer 226 are formed over the first metal element 210 and the second metal element 212 using the process steps described in reference to FIG. 1A through FIG. 1E, so as to electrically couple the first metal element 210 to the second metal element 212. The seed layer 222 and the copper pad 224 extend continuously from the first metal element 210 to the second metal element 212. An upper protective overcoat 228 as described in reference to FIG. 1F is formed over the integrated circuit 200 overlapping a top surface 230 of the metal cap layer 226 and covering a lateral surface 232 of the copper pad 224. A bond pad opening 234 is formed in the upper protective overcoat 228 as described in reference to FIG. 1F, for example over the first metal element 210. A bond pad 236 is formed in the bond pad opening 234 as described in reference to FIG. 1G. Forming the metal seed layer 222, the copper pad 224 and the metal cap layer 226 to electrically couple the first metal element 210 to the second metal element 212 may advantageously reduce fabrication cost and/or complexity of the integrated circuit 200.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps of:
    forming an interconnect region, said interconnect region including a top interconnect level and a metal element of said top interconnect level, said metal element being exposed in an area for a bond pad;
    forming a metal seed layer over said integrated circuit, so that said seed layer makes electrical contact to said metal element;
    forming a plating mask over said seed layer so as to expose an area over said metal element;
    performing a first plating operation to form a copper pad over said metal element in said exposed area of said plating mask, so that said copper pad makes electrical connection to said seed layer;
    performing a second plating operation to form a metal cap layer free of copper on a top surface of said copper pad;
    removing said plating mask;
    performing a seed layer etch to remove a portion of said seed layer outside said copper pad;
    forming an upper protective overcoat over said integrated circuit, said upper protective overcoat overlapping a top surface of said metal cap layer and covering said lateral surface of said copper pad, said upper protective overcoat having a bond pad opening which exposes a portion of said top surface of said metal cap layer; and
    forming a bond pad of electroless plated metal in said bond pad opening, said bond pad making electrical connection to said metal cap layer.

2. The process of claim 1, in which said metal cap layer includes nickel between 1 to 3 microns thick.

3. The process of claim 1, in which said metal cap layer includes a metal selected from the group consisting of: nickel, palladium, gold and any combination thereof.

4. The process of claim 1, in which said step of forming said metal cap layer includes an electroplating process.

5. The process of claim 1, in which said step of forming said metal cap layer includes an electroless plating process.

6. The process of claim 1, in which said upper protective overcoat includes polyimide.

7. The process of claim 1, in which step of forming said seed layer includes:
    sputtering layer of titanium tungsten alloy so that said layer of titanium tungsten alloy contacts said metal element; and
    sputtering a layer of copper on said layer of titanium tungsten alloy.

8. The process of claim 1, in which said bond pad provides a wirebond pad.

9. The process of claim 1, in which said step of forming said bond pad is performed so that a top surface of said bond pad is coplanar with a top surface of said upper protective overcoat within 100 nanometers.

10. The process of claim 1, in which said step of forming said bond pad includes plating a layer of nickel.

* * * * *